(12) United States Patent
Gregg et al.

(10) Patent No.: US 8,587,335 B2
(45) Date of Patent: Nov. 19, 2013

(54) METHODS FOR PROVIDING PROPER IMPEDANCE MATCHING DURING RADIO-FREQUENCY TESTING

(75) Inventors: Justin Gregg, San Francisco, CA (US); Joshua G. Nickel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 392 days.

(21) Appl. No.: 13/163,242

(22) Filed: Jun. 17, 2011

(65) Prior Publication Data
US 2012/0319697 A1 Dec. 20, 2012

(51) Int. Cl.
*G01R 31/00* (2006.01)
*G01R 31/28* (2006.01)

(52) U.S. Cl.
USPC .............. 324/756.06; 324/555; 324/511

(58) Field of Classification Search
USPC ............ 324/76.11, 756.01, 756.06, 511, 500, 324/555, 537; 455/67.11, 67.14, 73, 78, 80, 455/90.3, 115.1, 115.2, 575.7
See application file for complete search history.

(56) References Cited

U.S. PATENT DOCUMENTS

| | | | |
|---|---|---|---|
| 5,510,714 A * | 4/1996 | Takahashi et al. ............ 324/318 |
| 5,577,269 A | 11/1996 | Ludewig | |
| 5,594,358 A * | 1/1997 | Ishikawa et al. ......... 324/754.31 |
| 5,710,984 A | 1/1998 | Millar et al. | |
| 6,469,673 B2 | 10/2002 | Kaiponen | |
| 6,943,739 B1 | 9/2005 | Rousu et al. | |
| 7,020,443 B2 | 3/2006 | Talvitie et al. | |
| 2006/0234634 A1 | 10/2006 | Agnus et al. | |
| 2009/0146891 A1 | 6/2009 | Chen | |
| 2011/0003564 A1 | 1/2011 | Descombes et al. | |
| 2011/0039504 A1 | 2/2011 | Nguyen et al. | |

OTHER PUBLICATIONS

Nickel et al., U.S. Appl. No. 13/086,670, filed Apr. 14, 2011.
Nickel et al., U.S. Appl. No. 13/103,892, filed May 9, 2011.

* cited by examiner

*Primary Examiner* — Hoai-An D Nguyen
(74) *Attorney, Agent, or Firm* — Treyz Law Group; Jason Tsai (57) ABSTRACT

Wireless electronic devices may include a transceiver, an antenna resonating element coupled to the transceiver via a transmission line path, transceiver and antenna impedance matching circuits, and other circuitry. The transceiver and the impedance matching circuits may be formed on a first substrate. The antenna resonating element may be formed using a second substrate. The antenna resonating element may be decoupled from the first substrate during testing. First and second sets of test points may be formed at first and second locations long the transmission line path. During testing, a test probe may mate with the first set of test points, whereas an impedance adjustment circuit that serves to electrically isolate the antenna impedance matching circuit from the transceiver may mate with the second set of test points. The impedance adjustment circuit need not be used if the antenna impedance matching circuit is decoupled from the transceiver during testing.

21 Claims, 5 Drawing Sheets

METHODS FOR PROVIDING PROPER IMPEDANCE MATCHING DURING RADIO-FREQUENCY TESTING

BACKGROUND

This relates to testing and, more particularly, to testing of electronic device structures.

Electronic devices such as computers, cellular telephones, music players, and other electronic equipment are often provided with wireless communications circuitry. In a typical configuration, the wireless communications circuitry includes a radio-frequency transceiver that is coupled to an antenna through a radio-frequency switch connector. The transceiver, the switch connector, and an impedance matching circuit are formed on a printed circuit board. The antenna is connected to the printed circuit board through an antenna connector or other coupling mechanism (i.e., via a screw or a spring).

During normal device operation, the switch connector serves to electrically connect the transceiver to the antenna so that radio-frequency signals can be conveyed between the transceiver and the antenna. During testing, a radio-frequency test probe is mated with the switch connector to perform radio-frequency testing on the transceiver (i.e., by decoupling the antenna from the transceiver). The test probe is connected to a test box such as a vector network analyzer through a coaxial cable. Radio-frequency test signals are conveyed between the vector network analyzer and the transceiver during transceiver testing.

To satisfy consumer demand for small form factor wireless devices, manufacturers are continually striving to implement wireless communications components using compact structures. As device size continues to decrease, there may be insufficient space for the placement of the switch connector on the printed circuit board. To test the transceiver in the absence of the switch connector, the transceiver may be accessed via the antenna connector (with the antenna disconnected from the printed circuit board). If, however, the antenna is decoupled from the antenna connector and the impedance matching circuit is connected in series between the transceiver and the antenna connector on the printed circuit board, the test probe connected to the antenna connector will not see a 50 ohm impedance looking into the transceiver.

In view of these considerations, it would be desirable to provide improved ways for testing wireless transceiver circuitry.

SUMMARY

Electronic devices may include wireless transceiver circuitry and antenna circuitry. The wireless transceiver circuitry may include a cellular telephone transceiver, a wireless local area network transceiver, a satellite navigation systems receiver, and other wireless communications circuitry. The antenna circuitry may include at least one antenna resonating element associated with a loop antenna, inverted-F antenna, strip antenna, planar inverted-F antenna, slot antenna, hybrid antenna that includes antenna structures of more than one type, or other suitable antennas.

The transceiver circuitry may be mounted on a substrate (e.g., a printed circuit board), whereas the antenna resonating element may be formed as a separate conductive element. The printed circuit board on which the transceiver circuitry is formed may sometimes be referred to as a main logic board. During normal device operation, radio-frequency signals may be conveyed between the transceiver circuitry and the antenna resonating element via a transmission line path (e.g., the transceiver circuitry may be coupled to a first end of the transmission line path, whereas the antenna resonating element may be coupled to a second end of the transmission line path).

The antenna resonating element may be coupled to the transceiver circuitry through first and second coupling structures. The first coupling structure may be formed on the printed circuit board, whereas the second coupling structure may be formed on the antenna resonating element. The first and second coupling structures may include conductive pads, radio-frequency connectors, springs, screws, or other coupling mechanisms.

Transceiver and antenna impedance matching circuits may be formed on the printed circuit board. In one suitable arrangement, the transceiver and the antenna impedance matching circuits are coupled in the transmission line path between the transceiver and the antenna resonating element. First and second sets of test points (e.g., test points that tap into the transmission line path at first and second locations along the transmission line path between the transceiver impedance matching circuit and the antenna impedance matching circuit) may be formed on the printed circuit board. During transceiver testing, a test probe may be used to mate with the first set of test points so that the test probe sees desired matching looking into the transceiver circuitry, whereas an impedance adjustment circuit (sometimes referred to as a temporary impedance matching circuit or a test impedance matching circuit) may be coupled to the second set of test points so that the test probe sees high impedance looking into the antenna resonating element (e.g., to isolate the antenna resonating element from the test probe).

In another suitable arrangement, the antenna matching circuit may be physically and electrically disconnected from the transceiver circuitry during testing. The first coupling structure may include first and second sets of electrical contacts formed on the printed circuit board. The transceiver impedance matching circuit may be connected to the first set of electrical contacts, whereas the antenna impedance matching circuit may be connected to the second set of electrical contacts. When the second coupling structure is removed from the first coupling structure (i.e., when the antenna resonating element is removed from the printed circuit board), the first set of electrical contacts may be electrically coupled to the transceiver circuitry 16 via the transmission line path, whereas the second set of electrical contacts may be electrically isolated from the first set of electrical contacts (e.g., the antenna impedance matching circuit is decoupled from the transceiver circuitry when the antenna resonating element is removed from the first coupling structure).

During transceiver testing, a test probe may be used to mate with the first set of electrical contacts. An impedance adjustment circuit need not be used, because the transceiver impedance matching circuit will allow the test probe to see a desired impedance of 50 ohms looking into the transceiver. The antenna impedance matching circuit will not interfere with transceiver testing because it is decoupled from the transceiver circuitry. After testing, the second coupling structure can be mated with the first coupling structure to couple the antenna impedance matching circuit back into the transmission line path. During normal device operation, antenna impedance matching circuit may serve to provide proper matching between the antenna resonating element and the transceiver circuitry. Further features of the present invention, its nature and various advantages will be more apparent from the accompanying drawings and the following detailed description.

DETAILED DESCRIPTION

Wireless electronic devices include antenna and transceiver circuitry that support wireless communications. Examples of wireless electronic devices include desktop computers, computer monitors, computer monitors containing embedded computers, wireless computer cards, wireless adapters, televisions, set-top boxes, gaming consoles, routers, and other electronic equipment. Examples of portable wireless electronic devices include laptop computers, tablet computers, handheld computers, cellular telephones, media players, and small devices such as wrist-watch devices, pendant devices, headphone and earpiece devices, and other miniature devices.

Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also handle the 2100 MHz band.

Electronic devices may use short-range wireless communications links to handle communications with nearby equipment. For example, electronic devices may communicate using the WiFi® (IEEE 802.11) bands at 2.4 GHz and 5 GHz and the Bluetooth® band at 2.4 GHz. It is sometimes desirable to receive satellite navigation system signals such as signals from the Global Positioning System (e.g., to receive GPS signals at 1575 MHz).

Figure 1:
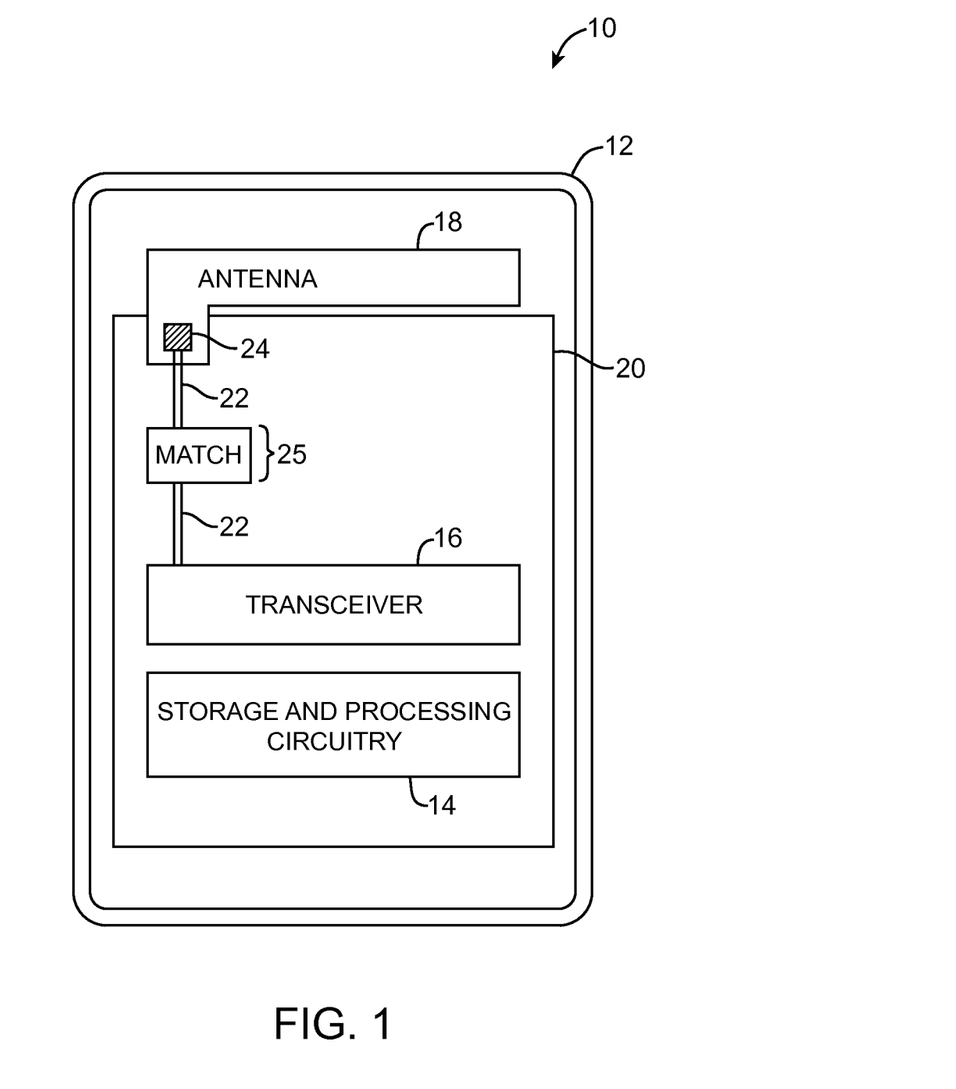
FIG. 1 is a diagram of an illustrative wireless electronic device in accordance with an embodiment of the present invention.

FIG. 1 is a diagram of an exemplary wireless electronic device. As shown in FIG. 1, device 10 may have a device housing structure such as housing structure 12 that forms a case for its associated components. Housing 12 may be formed from plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from conductive elements (e.g., a conductive peripheral bezel member).

Device 10 may include within its housing at least one antenna having an associated antenna resonating element 18, radio-frequency (RF) transceiver circuitry 16, storage and processing circuitry 14, input-output devices, and other electronic components. Storage and processing circuitry 14 and transceiver circuitry 16 may be mounted on a substrate such as printed circuit board (PCB) 20. Printed circuit board 20 may be, for example, a rigid printed circuit board formed from fiberglass-filled epoxy (e.g., FR-4) or may be a flexible printed circuit ("flex circuit") formed from a sheet of polymer such as a polyimide sheet. Printed circuit board 20 may, if desired, be mounted to housing structure 12. Storage and processing circuitry 14 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 14 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 14 may be used to run software on device 10, such as internet browsing applications, voice-over-internet-protocol (VOIP) telephone call applications, email applications, media playback applications, operating system functions, etc. To support interactions with external equipment, storage and processing circuitry 14 may be used in implementing communications protocols. Communications protocols that may be implemented using circuitry 14 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Radio-frequency transceiver circuitry (sometimes referred to as radio circuitry) 16 may include satellite navigation system receiver circuitry for receiving satellite positioning signals at 1575 MHz, wireless local area network (WLAN) circuitry for handling the 2.4 GHz and 5 GHz WiFi® (IEEE 802.11) communications bands and the 2.4 GHz Bluetooth® communications band, cellular telephone circuitry for handling telephone bands such as bands at 850 MHz, 900 MHz, 1800 MHz, 1900 MHz, and 2100 MHz, and other suitable types of transceiver circuitry.

Transceiver circuitry 16 may be coupled to antenna element 18 through a transmission line path 22 and coupling circuitry 24 (e.g., conductive coupling elements interposed between antenna element 18 and board 20). Coupling circuitry 24 may include radio-frequency connectors, a screw, a spring, or other suitable coupling mechanisms. Transmission line path 22 may include one or more segments of conductive traces formed in PCB 20 (e.g., a microstrip transmission line, a stripline transmission line, an edge coupled microstrip or stripline transmission line, etc.), one or more segments of coaxial cable, or other conduits through which radio-frequency signals can be conveyed between transceiver 16 and antenna element 18.

Antenna element 18 may include antenna resonating element conductive structures. Antenna element 18 may form at least a portion of a loop antenna, inverted-F antenna, strip antenna, planar inverted-F antenna, slot antenna, hybrid antenna that includes antenna structures of more than one type, or other suitable antennas. The conductive structures may, if desired, be formed from portions of housing structure 12. The conductive structures may also include patterned metal traces formed on a substrate such as a plastic support structure, a rigid printed circuit board, or a flex circuit.

Impedance matching circuitry such as transceiver impedance matching circuitry 25 (e.g., transceiver matching circuits, antenna matching circuit, etc.) may be formed on PCB and may be interposed in the transmission line path between transceiver 16 and antenna element 18 (e.g., impedance matching circuitry 25 may be formed in series between transceiver 16 and antenna element 18). During normal operation of device 10, impedance matching circuits 25-1 and 25-2 may serve to properly match antenna element 18 to transceiver 16 so that radio-frequency signals can be conveyed through transmission line path 22 between antenna element 18 and transceiver 16 with desired power efficiency.

The wireless communications circuitry within housing 12 may be tested and calibrated during production of device 10. The components being tested and calibrated may sometimes be referred to as device structures under test. Device structures under test may include transceiver circuitry 16, antenna resonating element 18, and other wireless communications circuitry. These device structures under test need not be attached to one another or completely assembled within housing 12 during testing.

Figure 2:
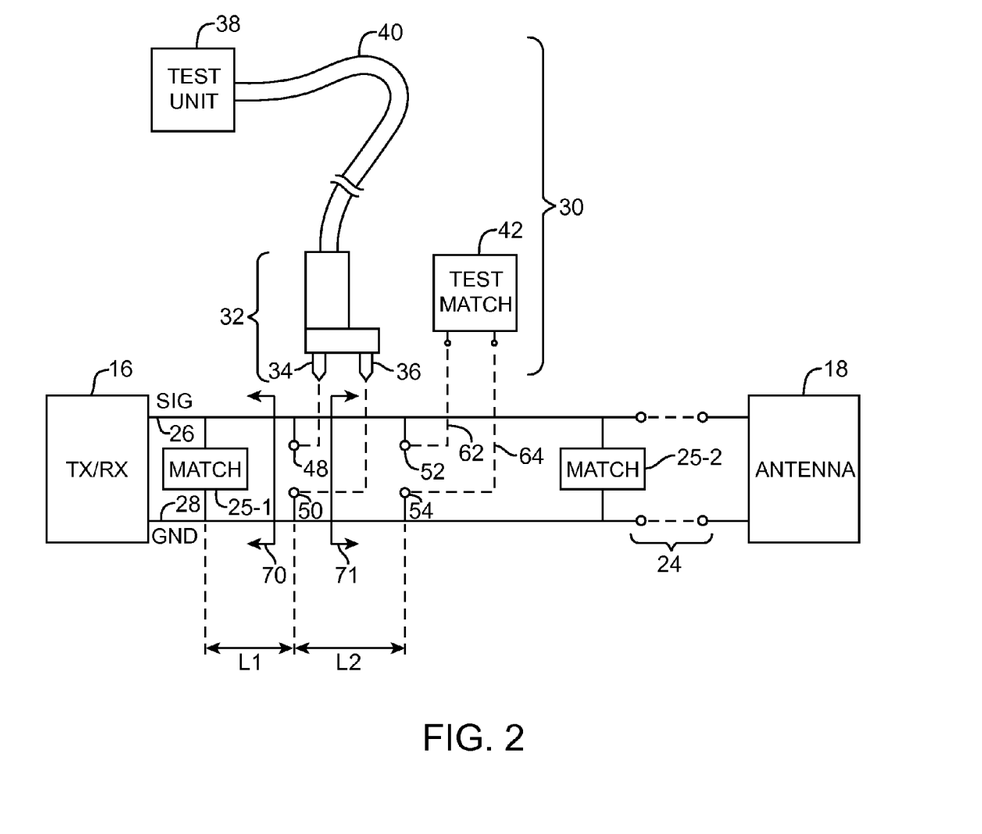
FIG. 2 is a diagram showing device structures being tested using an impedance adjustment circuit in accordance with an embodiment of the present invention.

FIG. 2 shows one possible arrangement for performing radio-frequency testing on the device structures under test in device 10. As shown in FIG. 2, the transmission line path connecting transceiver 16 to antenna element 18 may include a signal path 26 and a ground path (sometimes referred to as a signal return path) 28. Impedance matching circuits such as transceiver impedance matching circuit 25-1 and antenna impedance matching circuit 25-2 may be formed in the transmission line path between transceiver 16 and antenna element 18. Antenna element 18 may or may not be electrically connected to transceiver 16 during transceiver testing (i.e., antenna element 18 may be removably coupled to PCB 20 via coupling mechanism 24).

First and second sets of test points may be formed at first and second locations along the transmission line path between impedance matching circuits 25-1 and 25-2. The first set of test points may include signal test point 48 and ground test point 50. The second set of test points may include signal test point 52 and ground test point 54. Signal test points 48 and 52 may tap into the signal path 26, whereas ground test points 50 and 54 may tap into ground path 28. The first and second sets of test points may be formed on PCB 20 as conductive test pads, protruding test pins, conductive through holes, radio-frequency connectors (e.g., mini U.FL connectors), or other suitable types of conductive structures.

The device structures under test may be tested using test equipment. As an example, test equipment 30 may include a test unit 38, a test probe 32 that is connected to test unit 38 through a radio-frequency cable 40, and an impedance adjustment circuit 42 (sometimes referred to as a test impedance matching circuit). Cable 40 may, for example, be a coaxial cable that includes an inner signal conductor surrounded by a tubular ground shielding layer, where the signal conductor and the ground shielding layer are separated by dielectric insulating material.

Test unit 38 may include a signal generator that generates radio-frequency test signals over a range of frequencies. These test signals may be provided to test probe 32 over radio-frequency cable 40. Test unit 38 may also include a receiver that is capable of measuring wireless performance information on incoming signals (e.g., radio-frequency signals that are received by test probe 32 from transceiver 16 during testing).

With one suitable arrangement, test unit 38 may be a vector network analyzer (VNA) and a computer that is coupled to the vector network analyzer for gathering and processing test results. Tester 38 may, for example, be the CMU300 Universal Radio Communication Tester available from Rohde & Schwarz. This is, however, merely illustrative. Test unit 38 may be a radio communications tester of the type that is used to perform radio-frequency signaling tests for a variety of different radio-frequency communications bands and channels (e.g., test unit 38 may be a spectrum analyzer, a power meter, a wireless protocol tester, etc.).

Test probe 32 may be used to mate with the first set of test points during transceiver testing. For example, test probe 32 may include signal conductor 34 and ground conductor 36 that is used to make electrical contact with test points 48 and 50, respectively, while test probe 32 is in the mated state. Signal conductor 34 may be coupled to the inner signal conductor in cable 40, whereas ground conductor 36 may be coupled to the ground shielding layer in cable 40. At least one of test probe conductors 34 and 36 (sometimes referred to as test probe pins) may be spring-loaded to provide improved mate-ability during test operations.

Impedance adjustment circuit 42 may be temporarily mated with the second set of test points during transceiver testing. For example, impedance adjustment circuit 42 may have a first terminal that can be electrically connected to test point 52 (as indicated by dotted line 62) and a second terminal that can be electrically connected to test point 54 (as indicated by dotted line 64). Impedance adjustment circuit 42 may be disconnected from the second set of test points during normal operation of device 10.

When circuit 42 is mated with the second set of test points (i.e., by connecting circuit 42 at least partly in parallel with impedance matching circuit 25-2), impedance adjustment circuit 42 may serve to decouple antenna impedance matching circuit 25-2 from transceiver 16 (e.g., test probe 32 will see high impedance looking into the antenna from reference point 71 while impedance adjustment circuit 42 is in the mated state). Providing high impedance using impedance adjustment circuit 42 may serve to direct most of test radio-frequency signals to transceiver 16 during testing. Impedance adjustment circuit 42 may include discrete resistors, capacitors, and inductors mounted on a semiconductor substrate, integrated impedance matching circuits, and other electrical components coupled in any desired series-parallel configuration.

When test probe 32 is mated with test points 48 and 50 at the first location along the transmission line path, it may see high impedance looking into the antenna (from reference point 71) and a desired 50 ohm impedance looking into the transceiver (from reference point 70). If impedance adjustment circuit 42 is not connected to the device structures under test, test probe 32 may not necessarily see high impedance looking into the antenna, which may result in test radio-frequency signals leaking undesirably towards the antenna element. The distance L1 between impedance matching circuit 25-1 and the first set of test points and distance L2 between the first and second set of test points may be carefully chosen so that test probe 32 sees the desired impedance values looking into the transceiver from reference point 70 and looking into the antenna from reference point 71.

If desired, impedance adjustment circuit 25-1 may be configured to provide any suitable impedance matching during transceiver testing (e.g., impedance adjustment circuit 25-1 may allow test probe 32 to see less than 50 ohms or greater than 50 ohms impedance looking into the first set of test points).

Impedance adjustment circuit 42 may be configured differently depending on whether antenna element 18 is connected to PCB 20 via coupling mechanism 24 during testing. For example, if antenna element 18 is to be connected to PCB 20 using coupling circuitry 24 during testing, impedance adjustment circuit 42 may be formed using a first configuration. If antenna element 18 is to be disconnected from PCB 20 during testing, impedance adjustment circuit 42 may be formed using a second configuration that is different than the first configuration (e.g., circuit 42 may be formed using different capacitance, inductance, and/or resistance values depending on whether antenna element 18 is removed from on-board coupling circuitry 24).

Figure 3A:
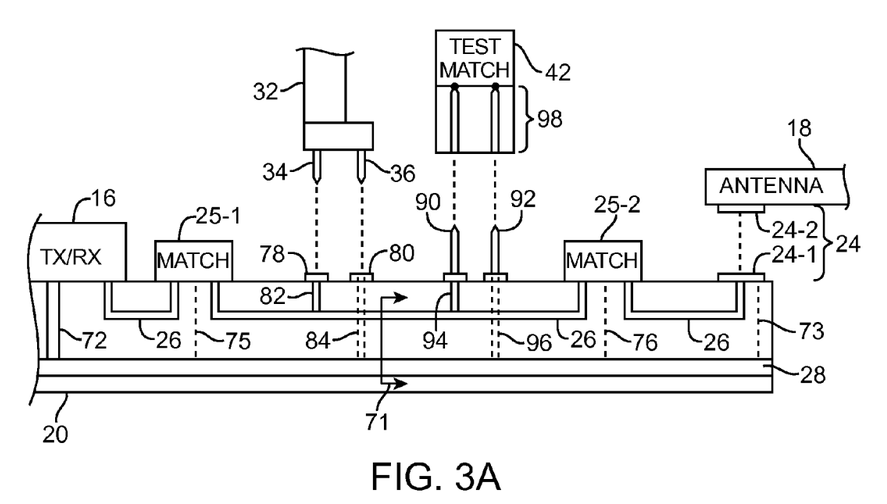
FIGS. 3A and 3B are cross-sectional side views of illustrative device structures under test having a jumper circuit that is coupled to an impedance adjustment circuit and that is configured to tap into a transmission line path between a transceiver and an antenna in accordance with an embodiment of the present invention.

With one suitable arrangement of the present invention, a jumper (sometimes referred to as a removable coupling circuit) may tap into the transmission line path between transceiver 16 and antenna element 18. As shown in FIG. 3A, radio-frequency signals may be conveyed between transceiver 16 and antenna element 18 through signal path 26 formed in at least one conductive trace routing layer in PCB 20. Ground path 28 may also be formed in at least one conductive trace routing layer in PCB 20. Transceiver 16 may be coupled to ground through via 72. In general, signal and ground paths 26 and 28 may include conductive traces formed in different trace routing layers (e.g., to form a microstrip transmission line), conductive traces formed in the same trace routing layer (e.g., to form an edge-coupled microstrip transmission line), signal and ground conductors in a coaxial cable, and/or other conductive structures suitable for conveying radio-frequency signals.

Coupling circuitry 24 may include antenna connectors 24-1 and 24-2 (as an example). Antenna connector 24-1 may be surface mounted on PCB 20 and may be connected to signal path 26 and shorted to ground through via 73. Antenna connector 24-2 may be attached to antenna resonating element 18. In this example, antenna element 18 may be coupled to transceiver 16 by mating antenna connector 24-2 with antenna connector 24-1. In other suitable arrangements, antenna element 18 may be coupled to PCB 20 through corresponding conductive pads (e.g., through antenna pad 24-1 formed on an upper surface of PCB 20 and antenna pad 24-2 formed on a lower surface of antenna resonating element 18), springs, screws, or other conductive structures.

Impedance matching circuits 25-1 and 25-2 may be formed in signal path 26 and may have ground terminals coupled to ground 28 through via 75 and 76, respectively. Probe pin test pads such as probe pin test pads 78 and 80 may be formed on the upper surface of PCB 20 (as an example). Test pad 78 may tap into signal path 26 through via 82, whereas test pad 80 may be shorted to ground through via 84. During testing, signal pins 34 and 36 in test probe 32 may be used to make physical contact with corresponding test pads 78 and 80 to performed desired radio-frequency measurements.

In the example of FIG. 3A, first and second jumper pins 90 and 92 may be formed on PCB 20. First jumper pin 90 may tap into signal path 26 through via 94, whereas second jumper pin 92 may be connected to ground 28 through via 96. During testing, a conductive sleeve 98 (sometimes referred to as a removable coupling circuit, a jumper shunt, or a jumper) may be mated with jumper pins 90 and 92 (i.e., jumper pin 90 may be inserted into a first corresponding hole in jumper 98, whereas jumper pin 92 may be inserted into a second corresponding hole in jumper 98). Jumper 98 may be coupled to associated impedance adjustment circuit 42. When jumper 98 is in the mated state, the first terminal of impedance adjustment circuit 42 may be coupled to signal path 26 through jumper pin 90 and the second terminal of impedance adjustment circuit 42 may be coupled to ground path 28 through jumper pin 92. Connecting impedance adjustment circuit 42 using this approach ensures that test probe 32 sees a high impedance value looking into the antenna from reference point 71. Jumper 98 coupled with impedance adjustment circuit 42 may be mated with pins 90 and 92 only during test operations (i.e., jumper 98 may be removed during normal device operation).

Figure 3B:
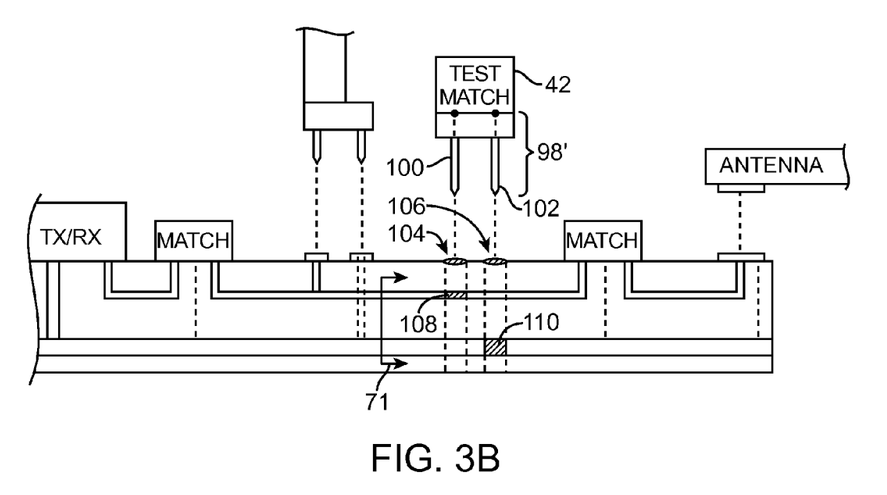

In another suitable arrangement of the present invention, through holes 104 and 106 may be formed in PCB 20 instead of protruding jumper pins 90 and 92. As shown in FIG. 3B, through hole 104 may be a conductive through hole that taps into signal path 26 (as indicated by connection 108), whereas through hole 106 may be a conductive through hole that taps into ground path 28 (as indicated by connection 110).

During transceiver testing, through holes 104 and 106 may be mated with a corresponding removable coupling circuit 98'. Circuit 98' (which may also be referred to as a jumper) may include jumper pins 100 and 102 that can be inserted into holes 104 and 106, respectively. Jumper 98' may be coupled to associated impedance adjustment circuit 42. When jumper 98' is in the mated state, the first terminal of impedance adjustment circuit 42 may be coupled to signal path 26 through jumper pin 100, whereas the second terminal of impedance adjustment circuit 42 may be coupled to ground path 28 through jumper pin 102. Connecting impedance adjustment circuit 42 using this approach ensures that test probe 32 sees a high impedance value looking into the antenna from reference point 71. Jumper 98' having impedance adjustment circuit 42 may be inserted into PCB 20 only during test operations (i.e., jumper 98' may be removed during normal device operation).

The use of impedance adjustment circuit 42 described in connection with FIGS. 2, 3A, and 3B is merely illustrative and does not limit the scope of the present invention. If desired, impedance adjustment circuit 42 may be used during antenna testing to isolate transceiver 16 and transceiver impedance matching circuit 25-1 from test probe 32. In such scenarios, impedance adjustment circuit 42 may be connected at a third location along the transmission line path between the first location (i.e., the location associated with test probe 32) and impedance matching circuit 25-1. Connecting circuit 42 at the third location may allow test probe 32 to see high impedance looking into the transceiver and a desired 50 ohm impedance looking into the antenna (e.g., antenna matching circuit 25-2 may be configured to provide this 50 ohm impedance for test probe 32) during antenna testing. Depending on where impedance adjustment circuit 42 is mated along the transmission line path, transceiver testing or antenna testing may be performed (e.g., to provide bidirectional testing capability).

Figure 4:
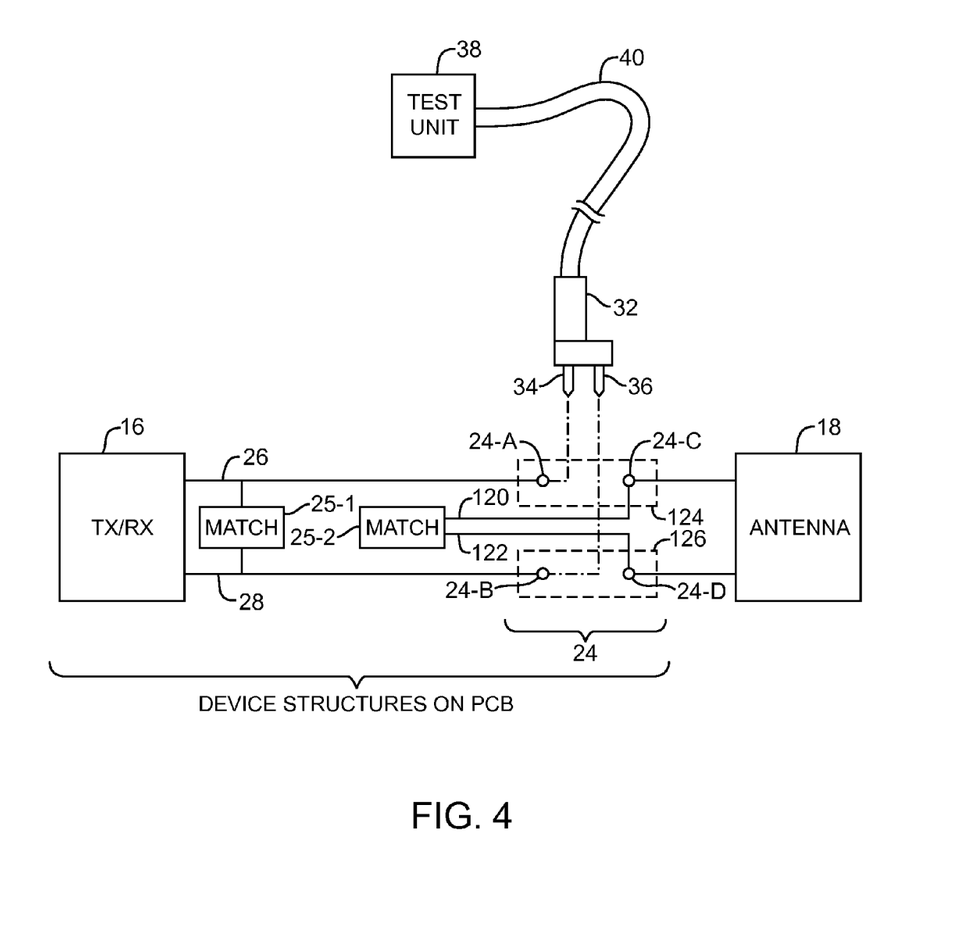
FIG. 4 is a diagram of illustrative device structures under test having an antenna impedance matching circuit that is decoupled from transceiver circuitry during testing in accordance with an embodiment of the present invention.

Antenna impedance matching circuit 25-2 may be decoupled from transceiver 16 during transceiver testing. As shown in FIG. 4, impedance matching circuits 25-1 and 25-2 may be formed on PCB 20. In the example of FIG. 4, coupling mechanism 24 may include first electrical contact 24-A, second electrical contact 24-B, third electrical contact 24-C, and fourth electrical contact 24-D. Electrical contact 24-A may be coupled to transceiver 16 through signal path 26, whereas electrical contact 24-B may be coupled to transceiver 16 through ground path 28.

When antenna element 18 is decoupled from PCB 20 (i.e., when antenna element 18 is removed from the electrical contacts), electrical contacts 24-C and 24-D may be disconnected from transceiver 16. Transceiver impedance matching circuit 25-1 may be coupled in parallel with electrical contacts 24-A and 24-B, whereas antenna impedance matching circuit 25-2 may be coupled to electrical contacts 24-C and 24-D through lines 120 and 122.

During test operations, antenna element 18 may be decoupled from PCB 20, signal pin 34 of test probe 32 may make electrical contact with electrical contact 24-A, and ground pin 36 of test probe 32 may mate with electrical contact 24-B. If desired, test probe 32 may make contact at other locations along the transmission line path during radio-frequency testing. Transceiver impedance matching circuit 25-1 may serve to provide a 50 ohm impedance for test probe 32 during transceiver testing. The loading of antenna impedance matching circuit 25-2 does not contribute to the impedance seen by test probe 32, because circuit 25-2 is electrically isolated from transceiver 16 during testing.

During normal operation, antenna element 18 may be coupled to PCB 20 by mating a first antenna shorting structure 124 with electrical contacts 24-A and 24-C (to short contacts 24-A and 24-C) and by mating a second antenna shorting structure 126 with electrical contacts 24-B and 24-D (to short contacts 24-B and 24-D). When antenna element 18 is coupled to PCB 20, antenna impedance matching circuit 25-2 may serve to properly match antenna element 18 to the device structures on PCB 20.

Figure 5A:
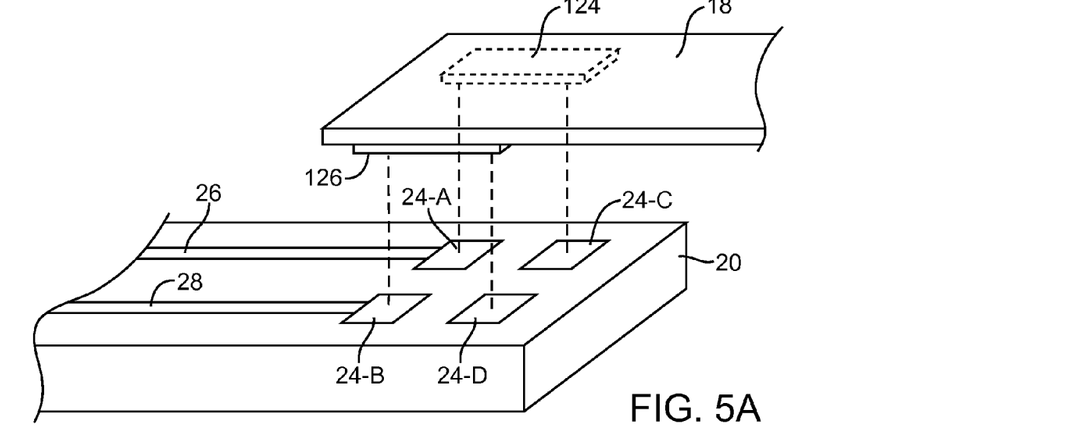
FIG. 5A is a perspective view of an illustrative coupling mechanism through which the transceiver circuitry and the antenna circuitry of FIG. 4 may be connected in accordance with an embodiment of the present invention.

FIG. 5A is a perspective view of one possible implementation of the coupling mechanism described in connection with FIG. 4. As shown in FIG. 5A, contacts 24-A, 24-B, 24-C, and 24-D may be conductive pads formed on the surface of PCB 20. Shorting structures 124 and 126 may be conductive pads formed on a flex circuit associated with antenna element 18 (as an example). While antenna element 18 is decoupled from PCB 20, antenna pads 24-A and 24-C are electrically isolated from each other, and antenna pads 24-B and 24-D are electrically isolated from each other.

Figure 5B:
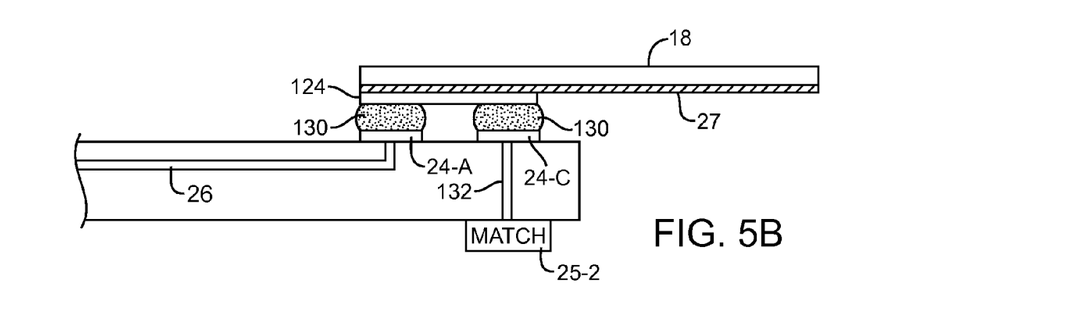
FIG. 5B is a cross-sectional side view of the coupling mechanism shown in FIG. 5A in accordance with an embodiment of the present invention.

FIG. 5B is a cross-sectional side view of the device structures under test in FIG. 5B when antenna element 18 is mated with the electrical contacts. As shown in FIG. 5B, antenna shorting pad 124 may be attached to conductive pads 24-A and 24-C using solder 130 (whereas antenna shorting pad 126 may be soldered to conductive pads 24-B and 24-D). If desired, antenna shorting pad 124 may be attached to pads 24-A and 24-C using conductive adhesive, using direct physical contact via applied pressure, or other means of coupling antenna element 18 to transceiver 16. A conductive trace 27 may be formed on the flex circuit of antenna element 18 to serve as a signal feed for antenna element 18.

Figure 5C:
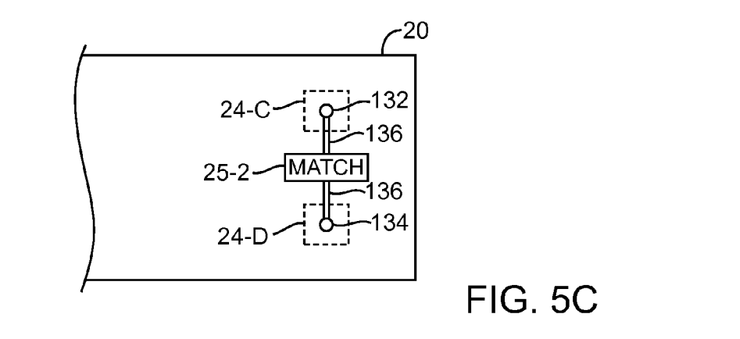
FIG. 5C is a bottom view of the device structures under test shown in FIG. 5B in accordance with an embodiment of the present invention.

Antenna impedance matching circuit 25-2 may be mounted on a lower surface of PCB 20. As shown in FIG. 5C, antenna impedance matching circuit 25-2 may have a first terminal that is coupled to contact 24-C through conductive path 136 and via 132 (equivalent to connection path 120 in FIG. 4) and a second terminal that is coupled to electrical contact 24-D through conductive path 136 and via 134 (equivalent to connection path 122 in FIG. 4). If desired, antenna matching circuit 25-2 may be formed on the upper surface of PCB 20.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of testing device structures under test with test equipment that includes a radio-frequency test probe, wherein the device structures under test include a transmission line path, radio-frequency transceiver circuitry coupled to a first end of the transmission line path, and an antenna resonating element removably coupled to a second end of the transmission line path, the method comprising:
   temporarily coupling the radio-frequency test probe to the transmission line path at a first location along the transmission line path;
   temporarily coupling an impedance adjustment circuit to the transmission line path at a second location along the transmission line path; and
   while the radio-frequency test probe and the impedance adjustment circuit are coupled to the transmission line path, gathering radio-frequency test measurements through the radio-frequency test probe.

2. The method defined in claim 1, wherein temporarily coupling the impedance adjustment circuit to the transmission line path at the second location substantially isolates the radio-frequency test probe from the second end of the transmission line path, and wherein gathering the radio-frequency test measurements comprises gathering radio-frequency test measurement on the radio-frequency transceiver circuitry.

3. The method defined in claim 2, wherein the transmission line path includes first and second sets of test points, wherein temporarily coupling the radio-frequency test probe to the transmission line path at the first location comprises attaching the radio-frequency test probe to the first set of test points, and wherein temporarily coupling the impedance adjustment circuit to the transmission line path at the second location comprises attaching the impedance adjustment circuit to the second set of test points.

4. The method defined in claim 3, wherein the first set of test points comprise test pads, and wherein temporarily coupling the radio-frequency test probe to the transmission line path at the first location comprises attaching the radio-frequency test probe to the test pads.

5. The method defined in claim 4, wherein the second set of test points comprise test pins, and wherein temporarily coupling the impedance adjustment circuit to the transmission line path at the second location comprises attaching the impedance adjustment circuit to the test pins.

6. The method defined in claim 4, wherein the second set of test points comprise conductive through holes, wherein the impedance adjustment circuit is coupled to a jumper circuit having jumper pins, and wherein temporarily coupling the impedance adjustment circuit to the transmission line path at the second location comprises inserting the jumper pins in the conductive through holes.

7. The method defined in claim 1, wherein temporarily coupling the impedance adjustment circuit to the transmission line path at the second location substantially isolates the radio-frequency test probe from the first end of the transmission line path, and wherein gathering the radio-frequency test measurements comprises gathering radio-frequency test measurement on the antenna resonating element.

8. The method defined in claim 7, wherein the transmission line path includes first and second sets of test points, wherein temporarily coupling the radio-frequency test probe to the transmission line path at the first location comprises attaching the radio-frequency test probe to the first set of test points, and wherein temporarily coupling the impedance adjustment circuit to the transmission line path at the second location comprises attaching the impedance adjustment circuit to the second set of test points.

9. The method defined in claim 8, wherein the first set of test points comprise test pads, and wherein temporarily coupling the radio-frequency test probe to the transmission line path at the first location comprises attaching the radio-frequency test probe to the test pads.

10. The method defined in claim 9, wherein the second set of test points comprise test pins, and wherein temporarily coupling the impedance adjustment circuit to the transmission line path at the second location comprises attaching the impedance adjustment circuit to the test pins.

11. The method defined in claim 9, wherein the second set of test points comprise conductive through holes, wherein the impedance adjustment circuit is coupled to a jumper circuit having jumper pins, and wherein temporarily coupling the impedance adjustment circuit to the transmission line path at the second location comprises inserting the jumper pins in the conductive through holes.

12. A method of testing device structures under test with test equipment that includes a radio-frequency test probe, wherein the device structures under test include a transmission line path coupled between a first radio-frequency circuit and a second radio-frequency circuit, the method comprising:
connecting the radio-frequency test probe to a first set of test points in the transmission line path;
connecting a temporary impedance matching circuit to a second set of test points in the transmission line path that is interposed between the first set of test points and the second radio-frequency circuit, wherein the temporary impedance matching circuit electrically isolates the radio-frequency test probe and the second radio-frequency circuit; and
while the radio-frequency test probe is connected to the first set of test points, gathering radio-frequency test measurements on the first radio-frequency test circuit through the first set of test points.

13. The method defined in claim 12, wherein the first radio-frequency circuit comprises a wireless transceiver circuit, and wherein gathering radio-frequency test measurements on the first radio-frequency test circuit through the first set of test points comprises gather radio-frequency test measurement on the wireless transceiver circuit.

14. The method defined in claim 13, wherein the second radio-frequency circuit comprises an antenna resonating element, and wherein connecting the temporary impedance matching circuit to the second set of test points comprises connecting the temporary impedance matching circuit to the second set of test points to electrically isolate the radio-frequency test probe from the antenna resonating element.

15. The method defined in claim 14, wherein the device structures under test further comprise an antenna impedance matching circuit, and wherein the antenna impedance matching circuit is at least partly interposed between the antenna resonating element and the second set of test points in the transmission line path.

16. The method defined in claim 12, wherein the first radio-frequency circuit comprises an antenna resonating element, and wherein gathering radio-frequency test measurements on the first radio-frequency test circuit through the first set of test points comprises gathering radio-frequency test measurement on the antenna resonating element.

17. The method defined in claim 16, wherein the second radio-frequency circuit comprises a wireless transceiver circuit, and wherein connecting the temporary impedance matching circuit to the second set of test points comprises connecting the temporary impedance matching circuit to the second set of test points to electrically isolate the radio-frequency test probe from the wireless transceiver circuit.

18. The method defined in claim 17, wherein the device structures under test further comprise a transceiver impedance matching circuit, and wherein the transceiver impedance matching circuit is at least partly interposed between the wireless transceiver circuit and the second set of test points in the transmission line path.

19. A method in which device structures under test are tested using a radio-frequency test probe, wherein the device structures under test include a transmission line path, transceiver circuitry coupled to a first end of the transmission line path, an antenna resonating element removably coupled to a second end of the transmission line path through first and second sets of electrical contacts, an impedance matching circuit coupled to the second set of electrical contacts, and wherein the first set of electrical contacts is coupled to the transceiver circuitry through the transmission line path, the method comprising:
connecting the radio-frequency test probe to the transmission line path while the antenna resonating element is decoupled from the second set of electrical contacts and while the impedance matching circuit is decoupled from the first set of electrical contacts; and
gathering radio-frequency test measurements with the radio-frequency test probe while the radio-frequency test probe is coupled to the transmission line path and while the antenna resonating element is removed from the first and second sets of electrical contacts so that the impedance matching circuit is decoupled from the transmission line path.

20. The method defined in claim 19 further comprising:
coupling the impedance matching circuit to the transmission line path by attaching the antenna resonating element to the first and second sets of electrical contacts.

21. The method defined in claim 19, wherein connecting the radio-frequency test probe to the transmission line path comprises mating the radio-frequency test probe with the first set of electrical contacts.

* * * * *